US011390017B2

(12) United States Patent
Keller et al.

(10) Patent No.: US 11,390,017 B2
(45) Date of Patent: Jul. 19, 2022

(54) METHOD OF MANUFACTURING OPTICAL ARTICLE AND OPTICAL SHAPING APPARATUS

(71) Applicants: Essilor International, Charenton le Pont (FR); Nikon Corporation, Tokyo (JP)

(72) Inventors: Gerhard Keller, Charenton le Pont (FR); Estelle Netter, Charenton le Pont (FR); Christophe Provin, Kawasaki (JP); Masafumi Mizuguchi, Yokohama (JP); Gaku Asai, Tokyo (JP)

(73) Assignees: Essilor International, Charenton le Pont (FR); Nikon Corporation, Tokyo (JP)

( * ) Notice: Subject to any disclaimer, the term of this patent is extended or adjusted under 35 U.S.C. 154(b) by 237 days.

(21) Appl. No.: 16/618,391

(22) PCT Filed: Jun. 21, 2017

(86) PCT No.: PCT/JP2017/022918
§ 371 (c)(1),
(2) Date: Dec. 1, 2019

(87) PCT Pub. No.: WO2018/235209
PCT Pub. Date: Dec. 27, 2018

(65) Prior Publication Data
US 2020/0290268 A1    Sep. 17, 2020

(51) Int. Cl.
*B29C 64/129* (2017.01)
*B33Y 10/00* (2015.01)
(Continued)

(52) U.S. Cl.
CPC .......... *B29C 64/129* (2017.08); *B29C 64/277* (2017.08); *B29C 64/393* (2017.08);
(Continued)

(58) Field of Classification Search
CPC ... B29C 63/129; B29C 64/393; B29C 64/277; B33Y 10/00; B33Y 30/00; B33Y 50/02;
(Continued)

(56) References Cited

U.S. PATENT DOCUMENTS

| 2015/0277146 A1 | 10/2015 | Crespo Vázquez et al. |
| 2016/0036187 A1 | 2/2016 | Houzumi et al. |
| 2017/0082845 A1 | 3/2017 | Chen et al. |

FOREIGN PATENT DOCUMENTS

| JP | 2016-530127 A | 9/2016 |
| WO | WO 2009/087805 A1 | 7/2009 |

(Continued)

OTHER PUBLICATIONS

International Search Report from International Patent Application No. PCT/JP2017/022918, dated Mar. 8, 2018.
(Continued)

*Primary Examiner* — Yung-Sheng M Tsui
(74) *Attorney, Agent, or Firm* — SGPatents PLLC

(57) ABSTRACT

A method of manufacturing an optical article, wherein an output light flux generating process of generating an output light flux by inputting a light from a light source to an output setting element having a repetition structure; a cured layer forming process of forming a cured layer at an irradiation area that is formed in correspondence with the output area by introducing the output light flux through a projection optical system into a container in which light-curable resin is contained and a stage is arranged and condensing the output light flux; and a stage moving process of moving the stage in a desired distance along the direction of the output flux propagating, are sequentially performed in this order and an irradiation variation process of varying the irradiation area in the cured layer generating process are further included, thereby the optical article is formed on a surface of the stage.

14 Claims, 11 Drawing Sheets

(51) Int. Cl.
*B33Y 30/00* (2015.01)
*B33Y 50/02* (2015.01)
*B29C 64/393* (2017.01)
*B29C 64/277* (2017.01)
*B29D 11/00* (2006.01)
*G02B 26/08* (2006.01)
*B33Y 80/00* (2015.01)

(52) U.S. Cl.
CPC ........ *B29D 11/00009* (2013.01); *B33Y 10/00* (2014.12); *B33Y 30/00* (2014.12); *B33Y 50/02* (2014.12); *G02B 26/0833* (2013.01); *B33Y 80/00* (2014.12)

(58) Field of Classification Search
CPC .............. B33Y 80/00; B29D 11/00009; G02B 26/0833
See application file for complete search history.

(56) References Cited

FOREIGN PATENT DOCUMENTS

| | | |
|---|---|---|
| WO | WO 2015/014380 A1 | 2/2015 |
| WO | WO 2015/072921 A1 | 5/2015 |
| WO | WO-2015072921 A * | 5/2015 ........... B29C 64/129 |
| WO | WO 2017/53783 A1 | 3/2017 |

OTHER PUBLICATIONS

Office Action dated Jun. 15, 2021, in Japanese Patent Application No. 2019-571080.
Office Action dated Jun. 17, 2021, in Chinese Patent Application No. 201780092329.7.
Office Action dated Oct. 28, 2021, in Chinese Patent Application No. 201780092329.7.

* cited by examiner

METHOD OF MANUFACTURING OPTICAL ARTICLE AND OPTICAL SHAPING APPARATUS

TECHNICAL FIELD

The present invention relates to a method of manufacturing an optical article and an optical shaping apparatus.

BACKGROUND ART

A method for shaping an object layer by layer from a plurality of solidified layers by repeating steps by irradiating a light-curable resin (photopolymer) in a container through a bottom portion of a container which stores the light-curable resin with light, is known (Patent Literature 1).

CITATION LIST

Patent Literature

PTL 1: United States Patent Application Publication No. US 2016/036187

SUMMARY OF INVENTION

Technical Problem

In the above-described method, a micromirror device, e.g. a DMD (Digital Micromirror Device), is generally used for generating a desired shape light flux for irradiating the light-curable resin. The micromirror device has a plurality of micromirrors arranged on the surface thereof in two-dimensional repetition structure. A desired shape of reflection region is generated on the surface of the micromirror device by selectively controlling a direction of reflective surface of each of the micromirrors, and an image of the reflection region is projected to the light-curable resin.

The present inventors have identified that using DMD-base stereolithography as explained above the resulting manufactured optical article induces stereoscopic diffraction. When a light enters such optical article, diffracted light is generated, which make it difficult to use the optical article for its initial purpose. The present inventors note that this happens despite that an each layer of the optical article is insulated as a whole in each successive step of the process, in other words, it is the state that the whole of the optical article is not completely homogeneous and the laminating of each layer is in recognizable.

There would be a problem that an optical article like a lens using such an optical component does not have high optical performance because of a generation of the diffracted light as explained above. Acceptable level of the diffracted light generation depends on a required optical performance to the optical article. In general, in case that a light enters this optical article, it is desirable to hold down the intensity of a first-order diffracted light equal to or less than 6% of that of a zero-order light. Furthermore, in the optical article, to which higher optical performance is required, for instance, which is to be used under a condition in which the diffracted light tends to be distinguished easily, it is desirable to hold down the intensity of the first-order diffracted light equal to or less than 0.01% of that of the zero-order light.

There is thus a need to propose a manufacturing process, using DMD, that does not lead to such defects, or that, at least, present defects that are less perturbing for an end-user.

Solution to Problem

The present inventors propose a mechanism that could explain the formation of a diffracting structure when none was expected. Further, the present inventors propose technical solutions that enable to reduce the discomfort brought by the diffracting effect or even produce an optical article without this diffracting effect.

In the process of using DMD for light-curing the resin, in a projected region of the light-curable resin, an intensity of the projected light in a portion corresponding to an area of the micromirror itself is different from that in a portion corresponding to an area between adjacent micromirrors. Due to this, there is a subtle difference in a state of the light-curable resin between these two portions, and a reticulated periodical refractive index distribution corresponding to two-dimensional array of the micromirrors is generated in the cured layer of the light-curable resin.

Because the reticulated refractive index distribution is formed in the same position in layer by layer, stereoscopic periodical refractive index distribution is observed in the resulting manufactured optical article. When a light enters such optical article, diffracted light is generated due to the above-explained refractive index distribution. This phenomenon is explained next with reference to FIGS. 8 and 9.

FIG. 8 shows a case in which a light enters a conventional optical article along the direction of cured layer stacking, namely along the direction of the Z-axis. FIG. 9 shows a case in which the light enters the conventional optical article along the direction of the surface of cured layer, namely along the direction of the X-axis. It should be noted that, in all the figures of this application including FIGS. 8 and 9, straight line and dotted line inside the optical articles schematically show the domain at which the refractive index is different from that of periphery. As understood from FIGS. 8 and 9, in both cases, the light which entered the optical article passes through the stereoscopic periodical refractive index distribution explained above. In consequence, the diffracted light is generated in both cases. It is to be noted that, because the effect caused by the periodic refractive index distribution along the direction of cured layer stacking due to the distribution of the curing state is added, more diffracted lights will generate in the case shown in FIG. 9 than that in the case shown in FIG. 8.

According to the first aspect of the present invention, a method of manufacturing an optical article comprises: an output light flux generating process of generating an output light flux by inputting a light propagated from a light source to an output setting element having a repetition structure that generates a desired shape of output area and maintaining the desired shape of the output area for a desired period; a cured layer forming process of forming a cured layer at an irradiation area that is formed in correspondence with the output area by introducing the output light flux through a projection optical system into a container in which light-curable resin is contained and a stage is arranged and condensing the output light flux; a first direction stage moving process of moving the stage in a desired distance along the first direction of the output flux propagating, wherein the output light flux generating process, the cured layer forming process and the first direction stage moving process are sequentially performed in this order, and thereby forming the optical article on a surface of the stage, and wherein the method further comprises an irradiation variation process that reduces the diffraction effect that comes from the repetition structure in the optical article.

Due to the present invention the diffraction effect formed either by repetition structure by the output setting element or by repeating the forming of a layer above a prior layer can be reduced.

According to the second aspect of the present invention, in the method of manufacturing an optical article according to the first aspect, it is preferred that the irradiation variation process is conducted by at least one of: an output light flux diffusion by passing the output light flux through a diffusion element in a diffusion angle of 5 to 25 degrees that is arranged at the container or at the vicinity of the container; a second direction stage movement by moving the stage in a second direction which is perpendicular to the first direction in the cured layer generating process; a condensing position adjusting so that a condensing position of the output light flux by the projection optical system deviates from the position at which the cured layer is to be formed; a magnification variation by varying a magnification of the projection optical system in each of the cured layer generating processes; and a first direction stage moving distance setting in the first direction stage moving process by setting at least two different values.

According to the first variation of the second aspect of the present invention, in the method of manufacturing an optical article according to the first aspect, it is preferred that the irradiation variation process is conducted by at least one of: a second direction stage movement by moving the stage in a second direction which is perpendicular to the first direction in the cured layer generating process; a condensing position adjusting so that a condensing position of the output light flux by the projection optical system deviates from the position at which the cured layer is to be formed; a magnification variation by varying a magnification of the projection optical system in each of the cured layer generating processes; and a first direction stage moving distance setting in the first direction stage moving process by setting at least two different values; or a combination thereof.

According to the second variation of the second aspect of the present invention, in the method of manufacturing an optical article according to the first aspect, it is preferred that the irradiation variation process is conducted by at least one of: an output light flux diffusion by passing the output light flux through a diffusion element in a diffusion angle of 5 to 25 degrees that is arranged at the container or at the vicinity of the container; and a condensing position adjusting so that a condensing position of the output light flux by the projection optical system deviates from the position at which the cured layer is to be formed.

According to the third variation of the second aspect of the present invention, in the method of manufacturing an optical article according to the first aspect, it is preferred that the irradiation variation process is conducted by at least one of: a second direction stage movement by moving the stage in a second direction which is perpendicular to the first direction in the cured layer generating process; a magnification variation by varying a magnification of the projection optical system in each of the cured layer generating processes; and a first direction stage moving distance setting in the first direction stage moving process by setting at least two different values.

According to the fourth variation of the second aspect of the present invention, in the method of manufacturing an optical article according to the first aspect, it is preferred that the irradiation variation process is conducted by at least one of: an output light flux diffusion by passing the output light flux through a diffusion element in a diffusion angle of 5 to 25 degrees that is arranged at the container or at the vicinity of the container; and a condensing position adjusting so that a condensing position of the output light flux by the projection optical system deviates from the position at which the cured layer is to be formed, and at least one of: a second direction stage movement by moving the stage in a second direction which is perpendicular to the first direction in the cured layer generating process; and a magnification variation by varying a magnification of the projection optical system in each of the cured layer generating processes; and a first direction stage moving distance setting in the first direction stage moving process by setting at least two different values.

According to the third aspect of the present invention, in the method of manufacturing an optical article according to the first or second aspect, it is preferred that the output setting element is a micromirror device that includes a plurality of micromirrors, a reflective surface of each of the micromirrors can be set individually; the desired shape of output area is generated by controlling the reflective surface of each of the micromirrors; the output light flux is a reflected light flux which is reflected at the output area of the micromirror device; and a surface image in accordance with the output area of the micromirror device is formed at the irradiation area.

According to the fourth aspect of the present invention, in the method of manufacturing an optical article according to the second aspect, it is preferred that the diffusion angle of the output light flux passed through the diffusion element is in a diffusion angle of 8 to 12 degrees.

According to the fifth aspect of the present invention, in the method of manufacturing an optical component according to any one of the first through fourth aspects, it is preferred that the desired distance to be set for the first direction stage moving process has at least two different values.

According to the first variation of the fifth aspect of the present invention, in the method of manufacturing an optical article according to the fifth aspect, it is preferred that the irradiation variation process is further conducted by at least one of: an output light flux diffusion by passing the output light flux through a diffusion element in a diffusion angle of 5 to 25 degrees that is arranged at the container or at the vicinity of the container; a second direction stage movement by moving the stage in a second direction which is perpendicular to the first direction in the cured layer generating process; a condensing position adjusting so that a condensing position of the output light flux by the projection optical system deviates from the position at which the cured layer is to be formed; and a magnification variation by varying a magnification of the projection optical system in each of the cured layer generating processes or a combination thereof.

According to the second variation of the fifth aspect of the present invention, in the method of manufacturing an optical article according to the fifth aspect, it is preferred that the irradiation variation process is further conducted by at least one of: a second direction stage movement by moving the stage in a second direction which is perpendicular to the first direction in the cured layer generating process; a condensing position adjusting so that a condensing position of the output light flux by the projection optical system deviates from the position at which the cured layer is to be formed; and a magnification variation by varying a magnification of the projection optical system in each of the cured layer generating processes or a combination thereof.

According to the third variation of the fifth of the present invention, in the method of manufacturing an optical article according to the fifth aspect, it is preferred that the irradiation variation process is further conducted by at least one of: an output light flux diffusion by passing the output light flux through a diffusion element in a diffusion angle of 5 to 25 degrees that is arranged at the container or at the vicinity of the container and a condensing position adjusting so that a condensing position of the output light flux by the projection optical system deviates from the position at which the cured layer is to be formed.

According to the fourth variation of the fifth aspect of the present invention, in the method of manufacturing an optical article according to the fifth aspect, it is preferred that the irradiation variation process is further conducted by at least one of: a second direction stage movement by moving the stage in a second direction which is perpendicular to the first direction in the cured layer generating process; and a magnification variation by varying a magnification of the projection optical system in each of the cured layer generating processes.

According to the fifth variation of the fifth aspect of the present invention, in the method of manufacturing an optical article according to the fifth aspect, it is preferred that the irradiation variation process is further conducted by at least one of: an output light flux diffusion by passing the output light flux through a diffusion element in a diffusion angle of 5 to 25 degrees that is arranged at the container or at the vicinity of the container; and a condensing position adjusting so that a condensing position of the output light flux by the projection optical system deviates from the position at which the cured layer is to be formed, and at least one of: a second direction stage movement by moving the stage in a second direction which is perpendicular to the first direction in the cured layer generating process; and a magnification variation by varying a magnification of the projection optical system in each of the cured layer generating processes.

According to the sixth aspect of the present invention, in the method of manufacturing an optical article according to any one of the first through fourth aspects, it is preferred that the desired distance to be set for the first direction stage moving process is randomized.

According to the seventh aspect of the present invention, in the method of manufacturing an optical article according to the sixth aspect, it is preferred that the desired distance to be set for the first direction stage moving process randomized as satisfying the following expression (1)

$$P_\alpha(1/T)/P_\alpha(0) \leq 0.001 \quad (1)$$

where, $P_\alpha(0) \geq 1$, T represents a constant value, $T + \alpha_k$ represents the k-th desired distance according to the thickness of the k-th layer, $\alpha_k$ represents a randomized value following a probability distribution of the Fourier transform of αk's probability density function $P_\alpha$.

According to the eighth aspect of the present invention, an optical shaping apparatus comprises: a light source; a container that contains light-curable resin; an output setting element having a repetition structure that receives a light propagated from the light source and sets an output light flux outputting toward the container; a stage that is, arranged in the container, movable along a first direction of the output flux propagating, and cured layer generated by curing the light-curable resin is formed on a surface thereof; a stage driving mechanism that drives the stage; a projection optical system that forms an irradiation area by condensing and introducing the output light flux into the container; and a first control unit, wherein the output setting element can generate a desired shape of output area and maintaining the desired shape of the output area for a desired period, the first control unit performs: a first controlling that performs to control the output setting element so as to generate a desired shape of output area and maintaining the desired shape of the output area for a desired period; and a second controlling that performs to control the stage drive mechanism so as to move the stage in a desired distance in the first direction after elapsing the desired period, and the optical shaping apparatus further comprises an irradiation variation device reduces the diffraction effect that comes from repetition in the forming of the optical article.

According to the ninth aspect of the present invention, the optical shaping apparatus according to the eighth aspect, it is preferred that the irradiation variation device comprises at least one of: a diffusion element diffuses the output light flux in a diffusion angle of 5 to 25 degrees arranged at the container or at the position being equal to or less than 5 mm from a surface of the container, a second control unit that controls a movement of the stage in a second direction which is perpendicular to the first direction; a third control unit that controls so as to change a condensing position of the projection optical system; a fourth control unit controls so as to change a magnification of the projection optical system; and a fifth control unit controls to set the desired distance at least two different values in the second controlling.

According to the tenth aspect of the present invention, the optical shaping apparatus according to the eighth or ninth aspect, it is preferred that the output setting element is a micromirror device that includes a plurality of micromirrors, a reflective surface of each of the micromirrors can be set individually; the desired shape of output area is generated by controlling the reflective surface of each of the micro mirrors; the output light flux is a reflected light flux which is reflected at the output area of the micromirror device; and a surface image in accordance with the output area of the micromirror device is formed at the irradiation area.

According to the eleventh aspect of the present invention, the optical shaping apparatus according to the ninth aspect, it is preferred that the diffusion element diffuses the output light flux in a diffusion angle of 8 to 12 degrees and arranged at the container or at the position being equal to or less than 1 mm from a surface of the container.

According to the twelfth aspect of the present invention, the optical shaping apparatus according to any one of the eighth through eleventh aspects, it is preferred that the first control unit controls so as to perform the first controlling and the second controlling repeatedly in turn.

According to the thirteenth aspect of the present invention, the optical shaping apparatus according to any one of the eighth through eleventh aspects, it is preferred that the first control unit controls in the second controlling so as to set the desired distance randomized.

According to the fourteenth aspect of the present invention, an optical article manufactured by the method according to any one of the first through seventh aspects, wherein when a light incidents on the optical article, a first-order light that is generated by diffraction is equal to or less than 6% of a zero-order light, or preferably equal or less than 5% or even 3%.

According to the fifteenth aspect of the present invention, the optical article according to the fourteenth aspect, it is preferred that the optical article is a lens.

Advantageous Effects of Invention

The present invention can provide an optical article having high optical performance that suppresses a generation of diffracted light, and also provide an optical shaping apparatus which manufactures an optical article having high optical performance that suppresses a generation of diffracted light.

DESCRIPTION OF EMBODIMENTS

First Embodiment

Figure 1:
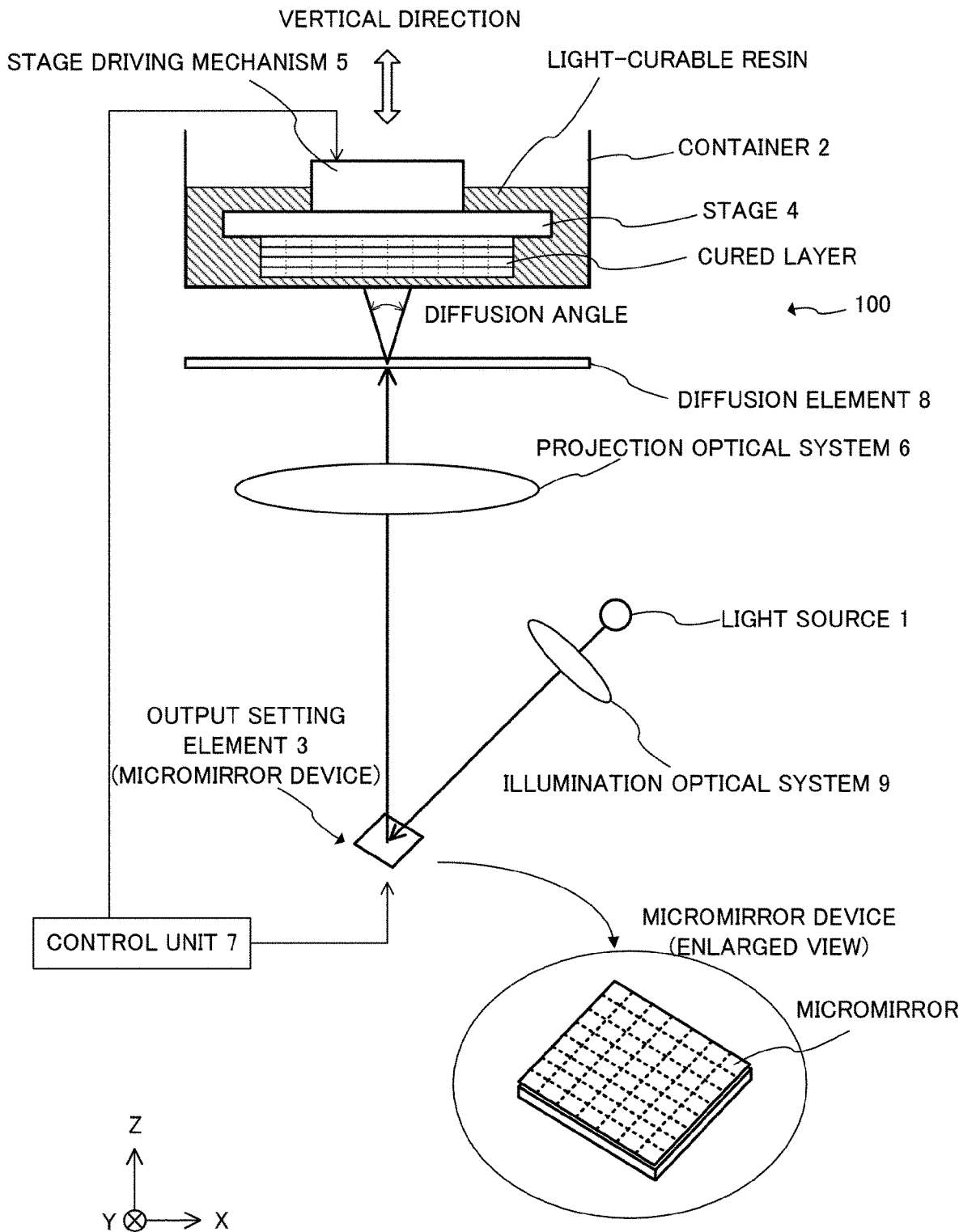
FIG. 1 is a schematic diagram showing a structure of an optical shaping apparatus according to the first embodiment of the present invention.

In the following description, an embodiment of the present invention is explained with reference to the figures. FIG. 1 is a schematic diagram showing the structure of an optical shaping apparatus 100 according to the first embodiment of the present invention. For convenience of explanation, an X-Y-Z coordinate system is set as illustrated in FIG. 1 as the X-axis is set in the horizontal direction, the Z-axis is set in the vertical direction and the Y-axis is set in the direction perpendicular to the X-axis and the Z-axis in the figure respectively. The optical shaping apparatus 100 mainly comprises a light source 1, a container 2, an output setting element 3, a stage 4, a stage driving mechanism 5, a projection optical system 6, control unit 7 and a diffusion element 8.

An LED light source which emits an ultraviolet light having a wavelength of 385 nm is used as the light source 1. A micromirror device is used as the output setting element 3. The container 2 has a bottom portion made of transparent fluororesin. The stage 4 is constructed of stainless steel. The output setting element 3 (the micromirror device 3) has a plurality of micromirrors arranged in the two-dimensional array on the surface thereof and each of the micromirrors can be controlled individually. The diffusion element 8 is located at the position outside the container 2 and close to the bottom portion thereof. The clearance between the diffusion element 8 and the bottom portion of the container 2 is approximately 5 mm. Diffusion angle of the diffusion element 8 is in a range between 5° and 25°. A light-curable resin (photopolymer) in a liquid state which is curable by irradiating ultraviolet light is contained in the container 2 in advance. The control unit 7, by controlling the stage driving mechanism 5, adjusts the position in the Z-axis direction (vertical direction in the figure) of the stage 4 so that adequate distance of clearance between the surface of the stage 4 and the bottom portion of the container 2 is formed. Then, the clearance between the surface of the stage 4 and the bottom portion of the container 2 is filled with the light-curable resin.

A procedure for manufacturing an optical article by using the optical shaping apparatus 100 will be explained below. The control unit 7 controls the micromirror device 3 to set the direction of the reflective surface of each of the micromirrors so as to form a desired shape of an output light flux from the micromirror device 3. The control unit 7 controls the light source 1 to emit an ultraviolet light to the micromirror device 3. The emitted ultraviolet light is converged by an illumination optical system 9 and then propagates to the micromirror device 3.

The ultraviolet light which has reached the micromirror device 3 is reflected based on the direction of the reflective surface set to each of the micromirrors and forms the desired shape of the output light flux. The output light flux enters the projection optical system 6 and is converged so as to focus an image of the surface of the micromirror device 3 on the light-curable resin filled between the surface of the stage 4 and the bottom portion of the container 2 in a desired irradiation area. At the same time, the output light flux is diffused by passing through the diffusion element 8, and then passes through the bottom portion of the container 2 and irradiates the light-curable resin. As a result, within the clearance between the surface of the stage 4 and the bottom portion of the container 2, the light-curable resin in the area corresponding to the above-explained irradiation area is cured and forms a cured layer.

After the formation of the cured layer is completed, the control unit 7 stops outputting of the ultraviolet light from the light source 1 and controls the stage driving mechanism 5 so that the stage 4 moves predetermined distance to the positive direction of the Z-axis and then stops. It is to be noted that, in this description, the positive direction of the Z-axis is also called a first direction. Because the surface energy of the surface of the stage 4 which is constructed of the stainless steel is higher than that of the surface of the bottom portion of the container 2 which is constructed of the transparent fluororesin, the cured layer is separated from the surface of the bottom portion of the container 2 and adheres to the surface of the stage 4. Namely, the cured layer adheres to the stage 4 and rises with the stage 4. In consequence, new clearance is formed between the cured layer and the bottom portion of the container 2, and the light-curable resin is again supplied to this clearance. The control unit 7 controls the direction of the reflective surface of each of the micromirrors of the micromirror device 3 so as to set the desired shape of the output light flux again. The control unit 7 controls the light source 1 to resume emitting an ultraviolet light toward the micromirror device 3; thereby a new cured layer is laminated on the cured layer that was already formed. By repeating above explained procedure, an optical article in desired shape is manufactured.

As described above, because the optical shaping apparatus 100 has the diffusion element 8 outside the container 2 and close to the bottom portion thereof, the output light flux is diffused moderately by the diffusion element 8 after being converged by the projection optical system 6 and irradiates the light-curable resin which is filled in the clearance between the stage 4 and the bottom portion of the container 2. In other words, the diffusion element 8 varies the irradiation area which is formed in the light-curable resin filled in the clearance between the stage 4 and the bottom portion of the container 2.

Figure 2:
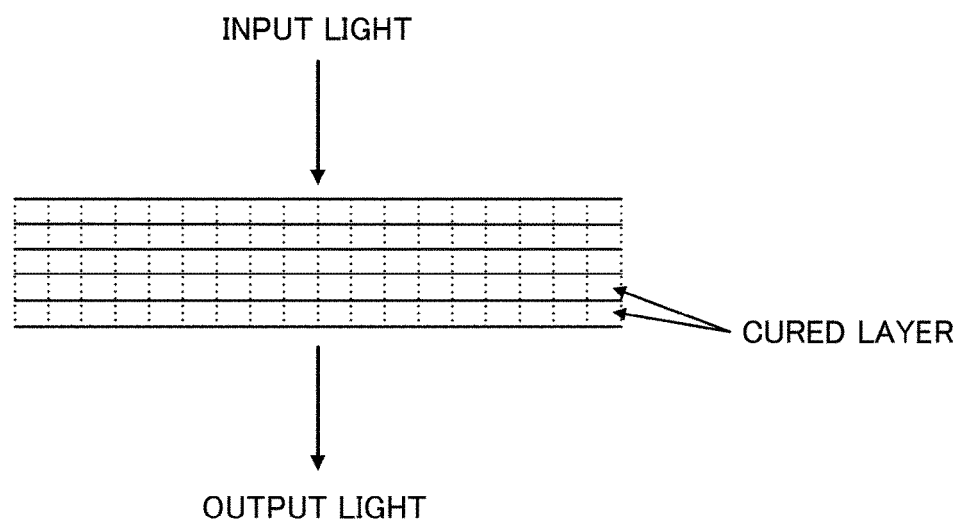
FIG. 2 is a schematic diagram showing an optical article which is manufactured in the first embodiment of the present invention.
Figure 2:
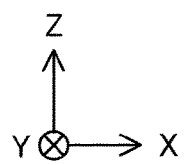

FIG. 2 schematically shows a cross section of the optical article manufactured by above explained procedure. As shown in FIG. 2, even if the periodical refractive index distribution corresponding to the two-dimensional array of the micromirrors is formed in each of the cured layer of the optical article, the degree of the refractive index distribution is relatively small. Therefore, when a light enters such optical article along the direction of cured layer stacking, it is possible to suppress a generation of the diffracted light so that the intensity of a first-order diffracted light is equal to or less than 6% of that of a zero-order light. Namely, the optical article with high optical performance is obtained.

As described above, the diffusion element 8 has a diffusion angle in a range between 5° and 25°, and is located at the position so that the clearance with the bottom portion of the container 2 is 5 mm. The diffusion angle of the diffusion element 8 and the clearance with the bottom portion of the container 2 should be determined appropriately based on a required optical performance to the optical article. In case that the diffusion angle is in a range between 8° and 12° of the diffusion element 8 and is located at the position so that the clearance with the bottom portion of the container 2 is 1 mm, it is possible to manufacture the optical article having a smooth profile from which the generation of the diffracted light is suppressed. It should be noted that, by adjusting the diffusion angle of the diffusion element 8 and the clearance between the diffusion element 8 and the bottom portion of the container 2, it is possible to suppress a generation of the diffracted light so that the intensity of a first-order diffracted light is equal to or less than 5% or 3% or even 0.01% of that of a zero-order light.

In above explanation, the starting (resuming) and stopping of the outputting of the light from the light source 1 is performed by controlling the light source 1 by the control unit 7. However, it is possible to turn on and off a continuously emitting light from the light source 1 by opening and closing a shutter which is located on the optical path. The shutter can be located at any position on the optical path, however, it is preferred that the shutter is located between the light source 1 and the micromirror device 3 because it is possible to use a smaller size shutter.

In the first embodiment, the light is converged by the projection optical system 6 and is diffused moderately by passing through the diffusion element 8; thereby the image of the micromirrors do not focus, in high contrast, on the light-curable resin which is filled in the clearance between the stage 4 and the bottom portion of the container 2. As a result, the contrast of the periodical refractive index distribution corresponding to the two-dimensional array of the micromirrors which is formed in the irradiation area of the light-curable resin reduces moderately. However, there is another method to reduce moderately the contrast of the image of the micromirrors on the light-curable resin other than using the diffusion element 8. The first embodiment explained above allows the following variations.

Variation 1

In the variation 1, the contrast of the periodical refractive index distribution corresponding to the two-dimensional array of the micromirrors which is formed in the light-curable resin is reduced moderately by slightly changing the condensing position of the projection optical system 6. Namely, it is accomplished by assuming the image formation of the micromirrors on the light-curable resin in a defocus state. In this case, it is preferred that the amount of the defocus is determined by adjusting the condensing position of the image of the micromirrors by the projection optical system 6. The degree of contrast of the image of the micromirrors may be adjusted by both of defocus state of the projection optical system 6 and using the diffusion element 8. For example, the defocus state is accomplished by shifting the condensing position of the projection optical system 6 to upward (positive direction of the Z-axis) or downward (negative direction of the Z-axis) from the position the light-curable resin filled between the surface of the stage 4 and the bottom portion of the container 2. The amount of shifting may be set so as to the condensing position of the projection optical system 6 being 1 through 5 times, for example, 1.5 through 2.5 times, of the thickness of the cured layer.

Variation 2

In the variation 2, the degree of contrast of the image of the micromirrors is adjusted by vibrating the micromirrors of the micromirror device 3 minutely and thereby the output light flux is vibrated moderately. In this way, the contrast of the periodical refractive index distribution corresponding to the two-dimensional array of the micromirrors which is formed in the light-curable resin is reduced moderately. It is preferred that the amount of vibration of the micromirrors is set so that the vibration has appropriate amount of articles of both directions of the two-dimensional array of the micromirrors.

Variation 3

In the variation 3, at least one of the light source 1, the micromirror device 3, the projection optical system 6 and the illumination optical system 9 are vibrated. Thereby, the contrast of the periodical refractive index distribution corresponding to the two-dimensional array of the micromirrors which is formed in the light-curable resin is reduced moderately. It is preferred that the amount of vibration of these is set so that the vibration has appropriate articles of both directions of the two-dimensional array of the micromirrors.

Second Embodiment

Figure 3:
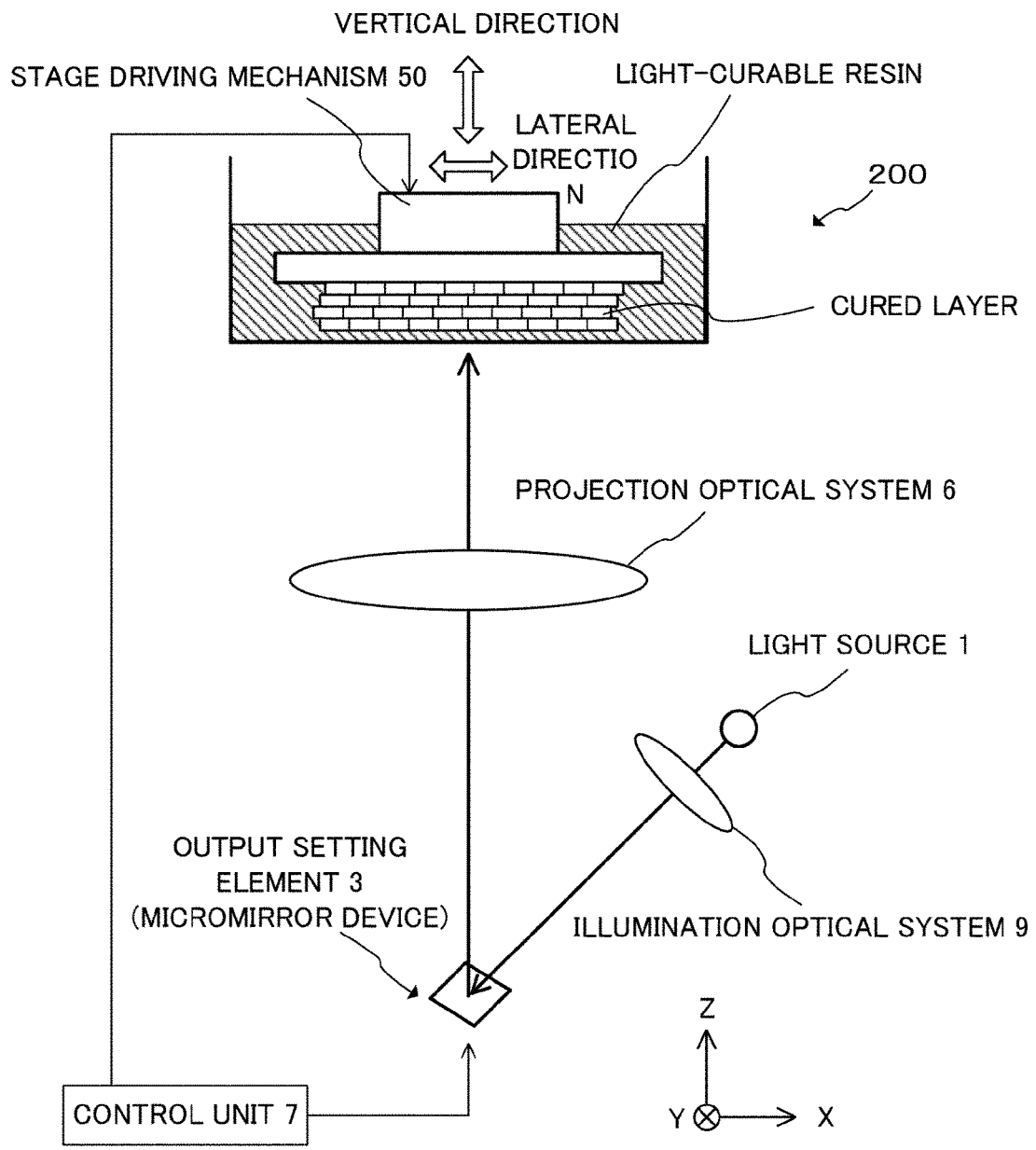
FIG. 3 is a schematic diagram showing a structure of an optical shaping apparatus according to the second embodiment of the present invention.

FIG. 3 is a schematic diagram showing the structure of an optical shaping apparatus 200 according to the second embodiment of the present invention. For convenience of explanation, an X-Y-Z coordinate system is set as illustrated in FIG. 3 as the X-axis is set in the horizontal direction, the Z-axis is set in the vertical direction and the Y-axis is set in the direction perpendicular to the X-axis and the Z-axis in the figure respectively. The optical shaping apparatus 200 does not equip the diffusion element 8. It is to be noted that the optical shaping apparatus 200 is different from the optical shaping apparatus 100 in that the optical shaping apparatus 200 has a stage driving mechanism 50 which can move the stage 4 to arbitrary direction in the plane parallel to the surface of the stage 4. Namely, in the optical shaping apparatus 200, the stage can be moved to arbitrary direction in a plane which is parallel to the X-Y plane. In the present description, any of the arbitrary direction is defined as a second direction.

A procedure for manufacturing an optical article by using the optical shaping apparatus 200 will be explained below. The processes of emitting light from the light source 1, forming the desired shape of the output light flux by reflecting the emitted light by the micromirror device 3 and passing through the light flux by the projection optical system 6 to converge it are substantially the same as processes of the first embodiment, therefore, explanation of these processes are omitted here. The output light flux converged by the projection optical system 6 passes through the bottom portion of the container 2 and irradiates the light-curable resin filled in the clearance between the surface of the stage 4 and the bottom portion of the container 2. Consequently, within this clearance, the light-curable resin in the portion corresponding to the irradiation area is cured and forms a first cured layer. In this description, the position of the stage 4 at that moment in the X-Y plane is defined as a first position.

After the formation of the first cured layer is completed, the control unit 7 stops outputting of the ultraviolet light from the light source 1 and controls the stage driving mechanism 50 so that the stage 4 moves predetermined distance to the positive direction of the Z-axis (the first direction) and then stops. As explained in the first embodiment, the first cured layer adheres to the stage 4 and rises with the stage 4. Next, the control unit 7 controls the stage driving mechanism 50 so that the stage 4 moves appropriate distance in the lateral direction (the second direction) and then stops. On this occasion, if it is in the X-Y plane, a moving direction of the stage 4 is possible in any direction. It is to be noted that, in this description, any direction in the X-Y plane is also called a second direction. In the present embodiment, the stage 4 moves to the position which is 5 µm to the positive direction in the X-axis from the first position. The position of the stage 4 at that moment in the X-Y plane is defined as a second position. Namely, the second position is 5 µm away to the positive direction in the X-axis from the first position. The control unit 7 controls the direction of the reflective surface of each of the micromirrors of the micromirror device 3 to set the desired shape of the output light flux again. The control unit 7 lets the light source 1 emit the ultraviolet light toward the micromirror device 3, thereby a second cured layer is formed.

After the formation of the second cured layer is completed, the control unit 7 stops outputting of the ultraviolet light from the light source 1 and controls the stage driving mechanism 50 so that the stage 4 moves predetermined distance to the positive direction of the Z-axis (to the first direction) and then stops. The second cured layer is laminated on the first cured layer which was already adhered to the surface of the stage 4, and these laminated layers raise with stage 4. In consequence, a clearance is generated between the second cured layer and the bottom portion of the container 2, and the light-curable resin is filled in this clearance. Next, the control unit 7 controls the stage driving mechanism 50 so that the stage 4 moves appropriate distance to the lateral direction and then stops. Specifically, the stage 4 moves to the position which is 5 µm to the negative direction in the X-axis direction and 5 µm to the positive direction in the Y-axis direction from the second position. The position of the stage 4 at that moment in the X-Y plane is defined as a third position. Namely, the third position is 5 µm away to the Y-axis-direction from the first position. The control unit 7 lets the light source 1 emit the ultraviolet light toward the micromirror device 3, thereby a third cured layer is formed.

After the formation of the third cured layer is completed, the control unit 7 stops outputting of the ultraviolet light from the light source 1 and controls the stage driving mechanism 50 so that the stage 4 moves predetermined distance to the positive direction of the Z-axis (to the first direction) and then stops. The third cured layer is laminated on the second cured layer, and these laminated layers raise with stage 4. In consequence, a clearance is generated between the third cured layer and the bottom portion of the container 2, and the light-curable resin is filled in this clearance. Next, the control unit 7 controls the stage driving mechanism 50 so that the stage 4 moves appropriate distance in the lateral direction (in the second direction) and then stops. Specifically, the stage 4 moves to the position which is 5 µm to the negative direction in the X-axis direction and 5 µm to the negative direction in the Y-axis direction from the third position. The position of the stage 4 at that moment in the X-Y plane is defined as a fourth position. Namely, the fourth position is 5 µm away to the negative direction in the X-axis direction from the first position. The control unit 7 lets the light source 1 emit the ultraviolet light toward the micromirror device 3, thereby a fourth cured layer is formed.

After the formation of the fourth cured layer is completed, the control unit 7 stops outputting of the ultraviolet light from the light source 1 and controls the stage driving mechanism 50 so that the stage 4 moves predetermined distance to the positive direction of the Z-axis (to the first direction) and then stops. The fourth cured layer is laminated on the third cured layer, and these laminated layers raise with stage 4. In consequence, a clearance is generated between the fourth cured layer and the bottom portion of the container 2, and the light-curable resin is filled in this clearance. Next, the control unit 7 controls the stage driving mechanism 50 so that the stage 4 moves appropriate distance in the lateral direction (in the second direction) and then stops. Specifically, the stage 4 moves to the position which is 5 µm to the positive direction in the X-axis direction and 5 µm to the negative direction in the Y-axis direction from the fourth position. The position of the stage 4 at that moment in the X-Y plane is defined as a fifth position. Namely, the fifth position is 5 µm away to the negative direction in the Y-axis direction from the first position. The control unit 7 lets the light source 1 emit the ultraviolet light toward the micromirror device 3, thereby a fifth cured layer is formed.

After the formation of the fifth cured layer is completed, the control unit 7 stops outputting of the ultraviolet light from the light source 1 and controls the stage driving mechanism 50 so that the stage 4 moves predetermined distance to the positive direction of the Z-axis (to the first direction) and then stops. The fifth cured layer is laminated on the fourth cured layer, and these laminated layers raise with stage 4. In consequence, a clearance is generated between the fifth cured layer and the bottom portion of the container 2, and the light-curable resin is filled in this clearance. Next, the control unit 7 controls the stage driving mechanism 50 so that the stage 4 moves appropriate distance in the lateral direction (in the second direction) and then stops. Specifically, the stage 4 moves to the position which is 5 µm to the positive direction in the X-axis direction and 5 µm to the positive direction in the Y-axis direction from the fifth position. The position the stage 4 reached is the same position as the second position. After that, the control unit 7 controls the stage driving mechanism 50 so that the stage 4 moves to the third position, the fourth position, the fifth position, the second position sequentially, thereby the cured layers are formed and then the optical article is manufactured.

Figure 4:
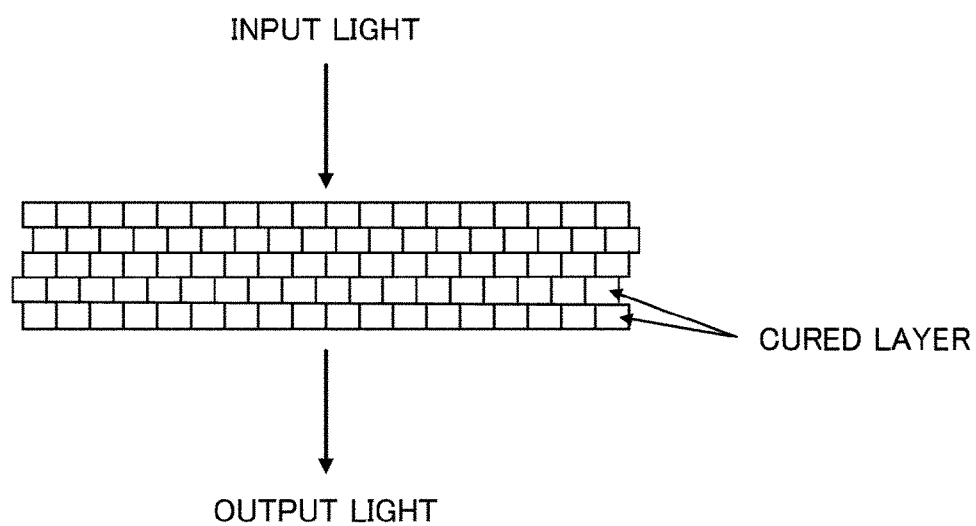
FIG. 4 is a schematic diagram showing an optical article which is manufactured in the second embodiment of the present invention.

FIG. 4 schematically shows a cross section of an optical article which was such manufactured. As shown in FIG. 4, although the periodical refractive index distribution corresponding to the two-dimensional array of the micromirrors is generated in each of the cured layers of the optical article, the refractive index distributions in adjacent cured layers do not overlap in the X-Y plane with each other. In consequence, in case that a light enters this optical article along the direction of layer stacking and diffracted light is generated, it is possible to hold down the intensity of the first-order diffracted light equal to or less than 6% of that of the zero-order light. Therefore, the optical article with high optical performance is obtained. It should be noted that, by adjusting the distances of moving of the stage 4 in the lateral direction (the second direction), it is possible to suppress a generation of the diffracted light so that the intensity of a first-order diffracted light is equal to or less than 5% or 3% or even 0.01% of that of a zero-order light.

As described above, the optical shaping apparatus 200 does not equip the diffusion element 8. However, the optical shaping apparatus 200 may equip the diffusion element. The optical article manufactured by using the optical shaping apparatus 200 which equips the diffusion element can hold down the generation of the diffracted light more effectively.

In the second embodiment, the control unit 7 controls the stage driving mechanism 50 to move the stage 4 moves in both of the X-axis direction and the Y-axis direction. However, the moving direction of the stage 4 can also be set to only one direction. For instance, the moving direction of the stage 4 can be set to the direction which is at 45° to the X-axis. Alternatively, the moving direction of the stage 4 can be set to the X-axis direction or the Y-Axis direction. It is to be noted that when an optical article is manufactured by setting the moving direction of the stage 4 to only one direction, and the light enters the optical article along the direction of cured layer stacking, the diffracted light of some intensity is generated in a direction perpendicular to the moving direction of the stage 4. It is preferred that the movement condition of the stage 4 is determined according to required optical performance to the optical article.

Third Embodiment

Figure 5:
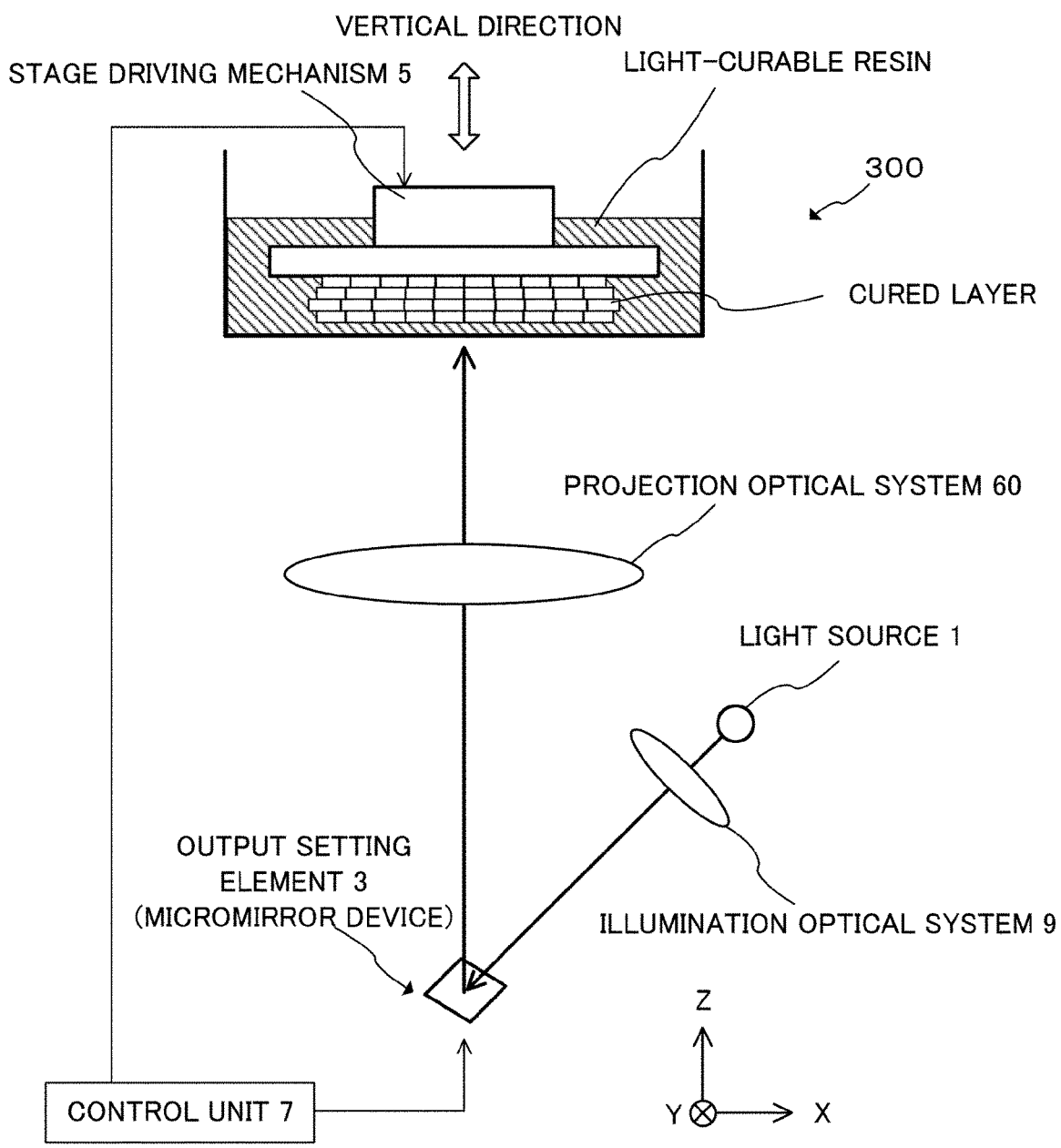
FIG. 5 is a schematic diagram showing a structure of an optical shaping apparatus according to the third embodiment of the present invention.

FIG. 5 is a schematic diagram showing the structure of an optical shaping apparatus 300 according to the third embodiment of the present invention. For convenience of explanation, an X-Y-Z coordinate system is set as illustrated in FIG. 5 as the X-axis is set in the horizontal direction, the Z-axis is set in the vertical direction and the Y-axis is set in the direction perpendicular to the X-axis and the Z-axis in the figure respectively. The optical shaping apparatus 300 is different from the optical shaping apparatus 100 in that the optical shaping apparatus 300 has a projection optical system 60 whose focal length is changeable and does not have the diffusion element 8. Except for above two points, the optical shaping apparatus 300 is substantially the same as the optical shaping apparatus 100. The projection optical system 60 is a power zoom lens and its focal length can be adjusted by the control unit 7. Thereby, a projection magnification of the image of the micromirrors of the micromirror device 3 projected to the light-curable resin which is filled in the clearance between the stage 4 and the bottom portion of the container 2 can be changed.

A procedure for manufacturing an optical article by using the optical shaping apparatus 300 will be explained below. The processes of emitting light from the light source 1 and forming the desired shape of the output light flux by reflecting the emitted light by the micromirror device 3 are substantially the same as those of the first embodiment, therefore, explanation of these processes are omitted here. The control unit 7 controls the micromirror device 3 so that a predetermined irradiation area is formed in the light-curable resin filled in the clearance between the stage 4 and the bottom portion of the container 2. This irradiation area is defined as an initial irradiation area. At the same instance, the control unit 7 controls the projection optical system 60 so as to adjust its focal length to be a predetermined value. The projection magnification of the image of the micromirrors of the micromirror device 3 performed by this focal length of the projection optical system 60 is defined as an initial projection magnification. The output light flux is converged by the projection optical system 60 and passes through the bottom portion of the container 2 and irradiates the light-curable resin filled in the clearance between the surface of the stage 4 and the bottom portion of the container 2. Consequently, within this clearance, the light-curable resin in the portion corresponding to the irradiation area is cured and forms a first cured layer.

After the formation of the cured layer is completed, the control unit 7 stops outputting of the ultraviolet light from the light source 1 and controls the stage driving mechanism 5 so that the stage 4 moves predetermined distance to the positive direction of the Z-axis (to the first direction) and then stops. As explained in the first embodiment, the cured layer adheres to the stage 4 and rises with the stage 4. Next, the control unit 7 controls the projection optical system 60 so as to change its focal length. The amount of the focal length change is determined so that the projection magnification (condensing magnification) of the image of the micromirrors of the micromirror device 3 increases around 10% compared with the initial projection magnification. At the same instance, the control unit 7 controls the direction of the reflective surface of each of the micromirrors of the micromirror device 3 so that the irradiation area is set again as decreasing around 10% compared with the initial irradiation area. The control unit 7 lets the light source 1 emit the ultraviolet light toward the micromirror device 3, thereby a second cured layer is formed.

After the formation of the second cured layer is completed, the control unit 7 stops outputting of the ultraviolet light from the light source 1 and controls the stage driving mechanism 5 so that the stage 4 moves predetermined distance to the positive direction of the Z-axis (to the first direction) and then stops. The second cured layer is laminated on the first cured layer which was already adhered to the surface of the stage 4, and these laminated layers raise with stage 4. In consequence, a clearance is generated between the second cured layer and the bottom portion of the container 2, and the light-curable resin is filled in this clearance. Next, the control unit 7 controls the projection optical system 60 so as to change its focal length. The amount of the focal length change is determined so that the projection magnification of the image of the micromirrors of the micromirror device 3 decreases around 5% compared with the initial projection magnification. At the same instance, the control unit 7 controls the direction of the reflective surface of the each of the micromirrors of the micromirror device 3 so that the irradiation area is set again as increasing around 5% compared with the initial irradiation area. The control unit 7 lets the light source 1 emit the ultraviolet light toward the micromirror device 3, thereby a third cured layer is formed. While appropriately changing the projection magnification and the irradiation area respectively on the initial projection magnification and the initial irradiation area, a desired shape of the optical article is manufactured by performing the above described processes repeatedly.

Figure 6:
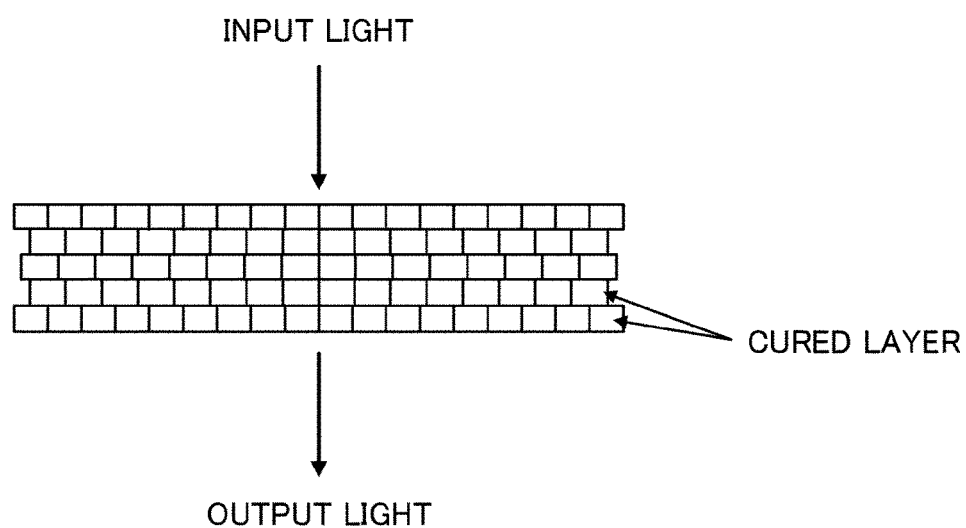
FIG. 6 is a schematic diagram showing an optical article which is manufactured in the third embodiment of the present invention.

FIG. 6 schematically shows a cross section of an optical article which was such manufactured. As shown in FIG. 6, although the periodical refractive index distribution corresponding to the two-dimensional array of the micromirrors is generated in each of the cured layers of the optical article, the refractive index distributions in adjacent cured layers do not overlap in the X-Y plane with each other. In consequence, in case that a light enters this optical article along the direction of cured layer stacking and diffracted light is generated, it is possible to hold down the intensity of the first-order diffracted light equal to or less than 6% of that of the zero-order light. Therefore, the optical article with high optical performance is obtained. It should be noted that, it is possible to adjust the projection magnification and/or the irradiation area so that the intensity of a first-order diffracted light is equal to or less than 5% or 3% or even 0.01% of that of a zero-order light.

As described above, the optical shaping apparatus 300 does not equip the diffusion element 8. However, the optical shaping apparatus 300 may equip the diffusion element. The optical article manufactured by using the optical shaping apparatus 300 which equips the diffusion element can hold down the generation of the diffracted light more effectively. It is to be noted that, changing rates of the projection magnification of the image of the micromirrors and the irradiation area are determined according to required optical performance to the optical article.

Figure 9:
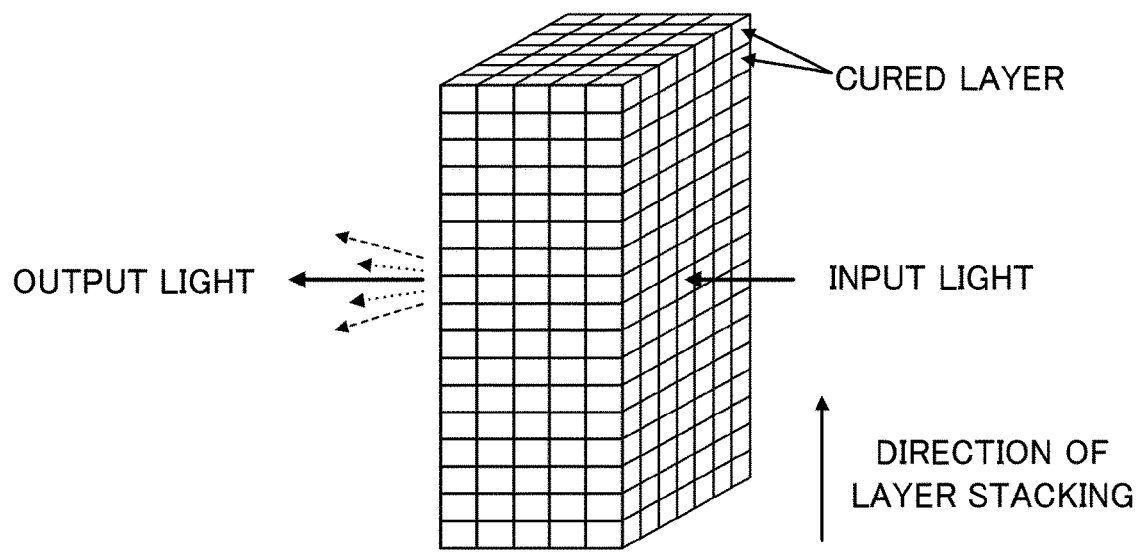
FIG. 9 is an explanatory diagram showing a generation of diffracted light when a light enters a conventional optical article along the direction of the surface of cured layer.
Figure 9:
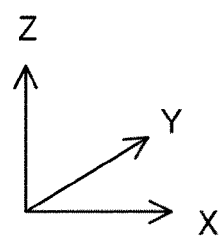

In above described each of the embodiments, the distance of moving the stage 4 to the positive direction of the Z-axis is constant after the completion of forming each of the cured layers. Namely, thickness of each of the cured layers of the optical article manufactured in each of the above described embodiments is constant. In case that a light enters such optical articles along the direction of cured layer stacking, it is possible to hold down the generation of the diffracted light as described above. However, in case that a light enters such optical articles along the direction of the surface of cured layer, the diffracted light is generated as shown in FIG. 9. A method for preventing generation of the diffracted light even in such case will be explained as follows.

Fourth Embodiment

In the present embodiment, an optical article is manufactured by using the optical shaping apparatus 100 from which the diffusion element 8 is removed. The procedure of manufacturing the optical article in the present embodiment will be explained below. The processes of emitting light from the light source 1, forming the desired shape of the output light flux by reflecting the emitted light by the micromirror device 3 and passing through the light flux by the projection optical system 6 to converge it are substantially the same as processes of the first embodiment, therefore, explanation of these processes are omitted here. The output light flux, after being converged by the projection optical system 6, irradiates the light-curable resin which is filled in the clearance between the stage 4 and the bottom portion of the container 2. Consequently, within this clearance, the light-curable resin in the portion corresponding to the irradiation area is cured and forms a first cured layer. It is to be noted that the thickness of this clearance of this time namely the distance between the surface of the stage 4 and the bottom portion of the container of this time is defined as a first distance. Therefore, the thickness of the first cured layer corresponds to the first distance.

After the formation of the first cured layer is completed, the control unit 7 stops outputting of the ultraviolet light from the light source 1 and controls the stage driving mechanism 5 so that the stage 4 moves predetermined distance to the positive direction of the Z-axis (to the first direction) and then stops. The moving distance (rising distance) of this time of the stage 4 is defined as a second distance. The second distance is set to be different from the first distance. As explained in the first embodiment, the first cured layer adheres to the stage 4 and rises with the stage 4. In consequence, a clearance corresponding to the second distance is generated between the first cured layer and the bottom portion of the container 2, and the light-curable resin is filled in this clearance. The control unit 7 controls the direction of the reflective surface of each of the micromirrors of the micromirror device 3 to set the desired shape of the output light flux again. The control unit 7 lets the light source 1 emit the ultraviolet light toward the micromirror device 3, thereby a second cured layer is laminated on the first cured layer. As described above, because the second distance is different from the first distance, the thickness of the second cured layer is different from that of the first cured layer.

After the formation of the second cured layer is completed, the control unit 7 stops outputting of the ultraviolet light from the light source 1 and controls the stage driving mechanism 5 so that the stage 4 moves predetermined distance to the positive direction of the Z-axis (to the first direction) and then stops. The moving distance of this time of the stage 4 is defined as a third distance. The third distance is set to be different from the second distance. The second cured layer is laminated on the first cured layer, and these laminated layers raise with stage 4. In consequence, a clearance corresponding to the third distance is generated between the second cured layer and the bottom portion of the container 2, and the light-curable resin is filled in this clearance. The control unit 7 controls the direction of the reflective surface of the each of the micromirrors of the micromirror device 3 to set the desired shape of the output light flux again. The control unit 7 lets the light source 1 emit the ultraviolet light toward the micromirror device 3, thereby a third cured layer is laminated on the second cured layer. Because the third distance is different from the second distance, the thickness of the third cured layer is different from that of the second cured layer.

After that, the control unit 7 controls the stage driving mechanism 5 so as to set the moving distance to raise the stage 4 to a value different from the value which was set in the previous setting, and cured layers are formed sequentially, thereby the optical article is manufactured. Namely, the moving distances are set randomized so as to have an appropriate deviation. As a result, the thicknesses of the cured layers of the optical article also have an appropriate deviation.

Figure 7:
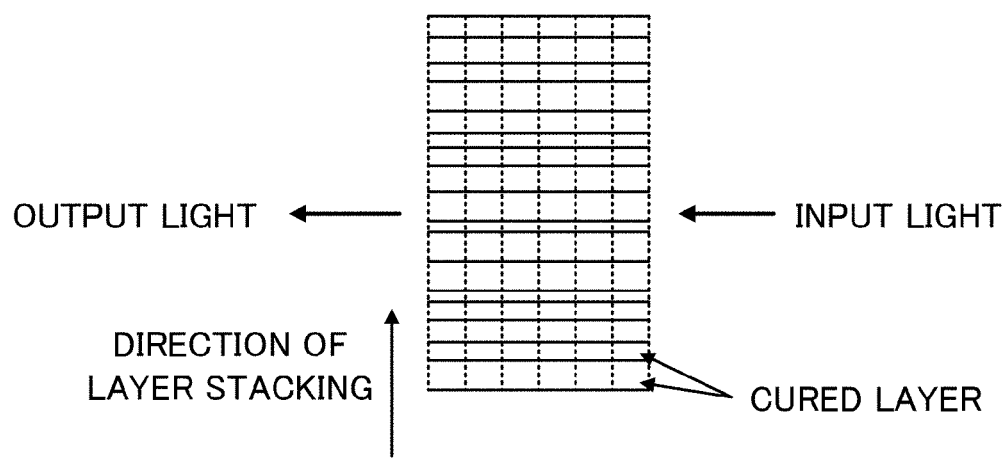
FIG. 7 is a schematic diagram showing an optical article which is manufactured in the fourth embodiment of the present invention.
Figure 8:
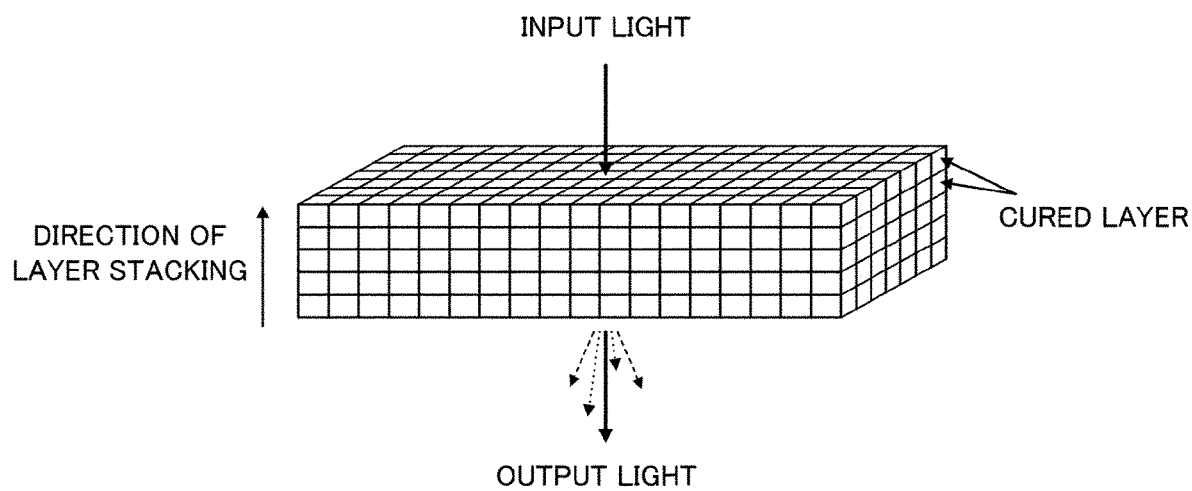
FIG. 8 is an explanatory diagram showing a generation of diffracted light when a light enters a conventional optical article along the direction of cured layer stacking.

FIG. 7 schematically shows a cross section of an optical article which was such manufactured. As shown in FIG. 7, there is an appropriate deviation in the thicknesses of the cured layers of the optical article. In consequence, in case that a light enters this optical article along the direction of the surface of the cured-layers and diffracted light is generated, it is possible to hold down the intensity of the first-order diffracted light equal to or less than 6% of that of the zero-order light. Therefore, the optical article with high optical performance is obtained. It should be noted that, by properly randomizing the deviation of the moving distance of the stage 4, it is possible to decrease the intensity of the diffracted light.

An average and a deviation of the moving distances can be set randomized based on a portional shape of the optical article. For instance, when forming cured layers corresponding to a portion at which shape greatly changes, the moving distances of the stage 4 are set randomized so that the average of them is relatively small and the standard deviation of them is relatively large. Thereby, it is possible to form such portion with a smooth surface. In contrast, when forming cured layers corresponding to a portion at which shape does not change greatly, the moving distances of the stage 4 are set randomized so that the average of them is relatively large and the standard deviation of them is relatively small. Thereby, it is possible to form such portion efficiently.

In case that an optical article requires different optical performances by a domain, the moving distances of the stage 4 can be set randomized based on the required optical performance to each of the domains. For instance, when forming cured layers corresponding to a domain of the optical article to which very high optical performance is required, the moving distances of the stage 4 are set randomized so that the standard deviation of them is relatively large. In contrast, when forming cured layers corresponding to a domain of the optical article to which very high optical performance is not required, the moving distances are set randomized so that the standard deviation of them is relatively small. Such manufactured optical article has the optical performance especially at the domain to which very high optical performance is required.

By setting randomized the moving distances of the stage 4, thicknesses of the cured layers are randomized. Due to this, the ratio of the diffraction efficiency of the first-order diffracted light and that of zero-order light is modulated. The magnitude of this modulation is expressed as $P_\alpha(1/T)/P_\alpha(0)$. Here, $P_\alpha(1/T)$ and $P_\alpha(0)$ are Fourier transforms of the provability density distribution respectively. In case that the thicknesses of the cured layers are uniform, in other words, in case that the thicknesses of the cured layers are not randomized, as explained above, the diffraction efficiency ratio of the first-order diffracted light and that of zero-order light exceeds 6% which corresponds below 12 dB. However, if the optical article which is used in a severe environment, for example, a lamp is exists in front of dark background, it is desirable to be below 40 dB which corresponds that the intensity of the first-order diffracted light falls below 0.01% of that of the zero-order light. Thus, it is desirable to set randomized the moving distances of the stage 4 so as to satisfy the following expression (1).

$$P_\alpha(1/T)/P_\alpha(0) \leq 0.001 \quad (1)$$

This expression (1) is the same as expression (1) as described above. Here, $P_\alpha(0) \geq 1$, T represents a constant value, $T+\alpha_k$ represents the k-th desired distance according to the thickness of the k-th layer, $\alpha_k$ represents a random value following a probability distribution of the Fourier transform of $\alpha k$'s probability density function $P_\alpha$.

The optical article manufactured by setting the moving distances of the stage 4 randomized as described above has high optical performance. In other words, in case that a light enters such optical article along the direction of the surface of the cured-layers and diffracted light is generated, it is possible to hold down the intensity of the first-order diffracted light equal to or less than 6% of that of the zero-order light. It should be noted that, by appropriately adjusting the randomization of the moving distances of moving of the stage 4 in the vertical direction, it is possible to suppress a generation of the diffracted light so that the intensity of a first-order diffracted light is equal to or less than 0.01% of that of a zero-order light.

It is to be noted that the diffusion element 8 is not used in the present embodiment as described above. Therefore, in the optical article shown in FIG. 7, generation of the diffracted light along the direction of cured layer stacking, namely along the direction of the Z-axis, can be reduced by randomization of the moving distances of moving of the stage 4. However, it is not possible to reduce the intensity of diffracted light generated along the direction of the surface of the cured layer, namely along the direction of the X-axis. This is because that the periodical refractive index distribution, corresponding to two-dimensional array of the micromirrors, exists in each cured layer of the optical article. In regard to this point, by using the optical shaping apparatus equipped with the diffusion element 8 as same as the optical shaping apparatus 100 shown in FIG. 1, it is possible to manufacture the optical article that generation of the diffracted light is reduced so that the intensity of a first-order diffracted light is equal to or less than 5% or 3% or even 0.01% of that of a zero-order light. It can be determined whether or not the diffusion element 8 is used based on the required optical performance to the optical article to be manufactured.

It should be noted that, for reduction of generation of the diffracted light along the direction of the Z-axis in addition to reduction of generation of the diffracted light along the direction of the Y-axis, it may be possible to adopt at least one of second direction stage movement, condensing position adjusting of the projection optical system, and magnification variation of the projection optical system in addition to randomization of the moving distances of moving of the stage.

Simulation

Figure 10:
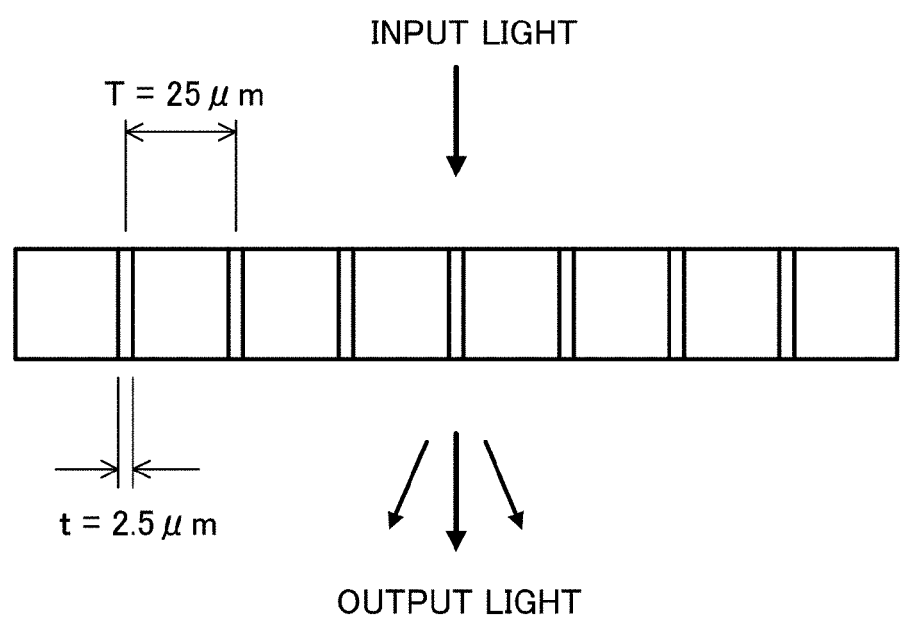
FIG. 10 is a schematic diagram showing a model used for the simulation.

Next, simulation for diffracted light generated when light enter an optical article having a periodical refractive index distribution will be explained. FIG. 10 is a schematic diagram showing a model used for the simulation. As shown in FIG. 10, this model has a structure in which unit cells are periodically arranged in cycle length T of 25 μm, and a space whose width t is 2.5 μm is arranged between each of unit cells. In other words, this model has a structure of the light-curable resin in which the spaces of 2.5 μm width are formed in each 25 μm interval. The structure in which light-curable resin and a space (air) are periodically arranged corresponds to the reticulated periodical refractive index distribution.

As shown in FIG. 10, when the light passes through the model so as to perpendicularly cross the arrangement of the unit cells, a phase difference between a light passes through a portion of the light-curable resin and a light passes through a portion of the space is generated due to a difference of optical pass between the portion of the light-curable resin and the portion of the space. Assuming that the phase difference is $\Delta\varphi$, the transfer function of the model shown in FIG. 10 is expressed by next expression (2).

$$f(x) = \left[rect\left(\frac{x}{T-t}\right) \times \delta\left(x + \frac{T-t}{2}\right)\right]e^{i0} + \left[rect\left(\frac{x}{t}\right) \times \delta\left(x - \frac{t}{2}\right)\right]e^{i\Delta\varphi} \quad (2)$$

Assuming that $\Delta\varphi$ equals to $\pi$, the intensity of p-th order diffracted light is expressed by next expression (3).

$$|F(\gamma)|^2_{\gamma=\frac{p}{T}} \propto \left|\frac{T-t}{T}\sin c\left(\pi(T-t)\frac{p}{T}\right)e^{i\frac{\pi p(T-t)}{T}} + \frac{t}{T}\sin c\left(\pi t\frac{p}{T}\right)e^{-i\frac{\pi pt}{T}}e^{i\Delta\varphi}\right|^2 \quad (3)$$

Calculating the ratio of the intensity of the first-order diffracted light to the zero-order light by the above expression, it is understood to be larger than 6%. From this result, it can be estimated that in case the model as shown in FIG. 10 is used as an optical element like a lens or a prism, it can be estimated that an optical article corresponding to such model does not have sufficient optical performance.

Figure 11:
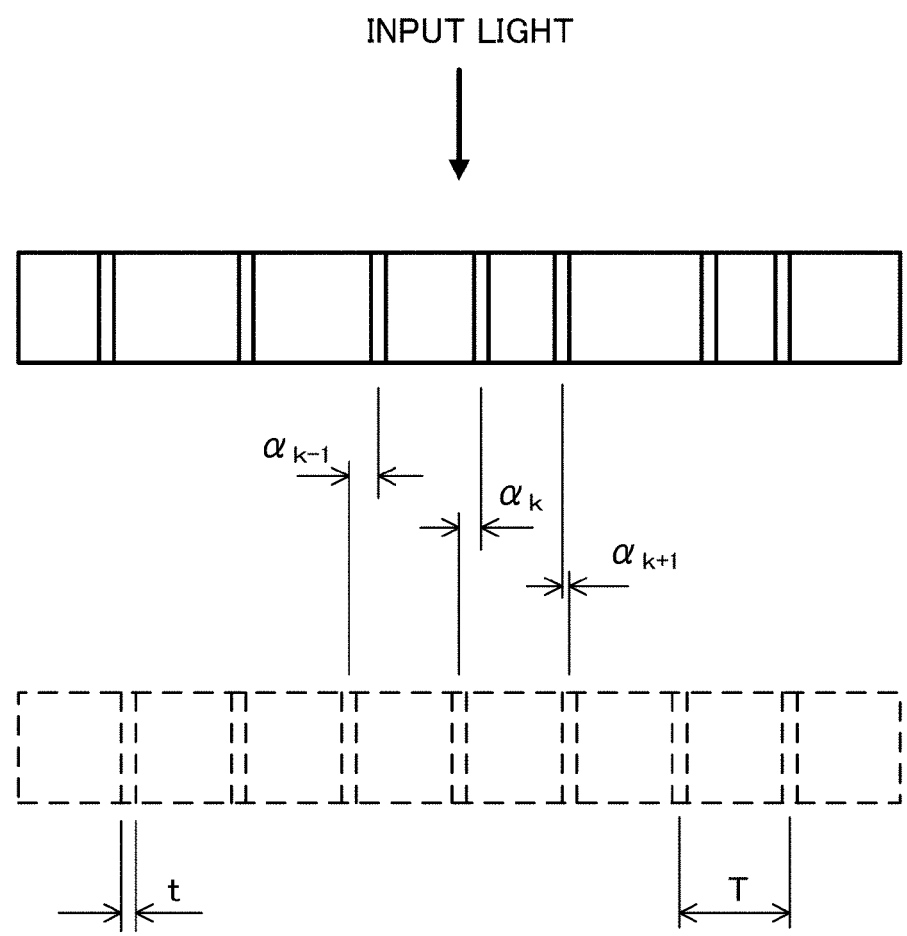
FIG. 11 is a schematic diagram showing a model used for the simulation.

Next, a simulation of the model in which cycle length T is not constant and it is randomized will be explained. FIG. 11 is a schematic diagram of a model used for the simulation. This model corresponds to, for example, an optical article manufactured by setting the moving distances of the stage 4 randomized. Comparing with the model shown in FIG. 10 which has a basic structure in which the spaces of width t are formed in each interval of cycle length T, the model shown in FIG. 11 differs from that positions of the spaces of width t are deviated from those of the positions of the model shown in FIG. 10. In other words, each of the cycle lengths T are randomized. It should be noted that, in FIG. 11, the portion shown by dotted lines represents the model shown in FIG. 10 in purpose of comparison.

By adopting such structure, in the model shown in FIG. 11, periodicity of the refractive index distribution is weakened. Specifically, this model is constructed so that the position of the center of the k-th unit cell is deviated in randomized distance $\alpha_k$ from the position of that in the basic model shown in FIG. 10. In other words, the center of the k-th unit cell $x_k$ is shifted from the position of the center of the k-th unit cell in the basic model so that $x_k = x - T - \alpha_k$ is satisfied.

Assuming that $\alpha < T - t$, and that $\alpha_k$ exists in the range of $[-\alpha/2, \alpha/2]$, the diffraction efficiency of the model is expressed by next expression (4).

$$\left| U(\gamma)_{\gamma = \frac{p}{T}} \right|^2 = P_\alpha(p/T)^2 \times |U_{without\ randomization}|^2 \quad (4)$$

Here, $P_\alpha(\gamma)$ represents the probability density function and $U_{without\ randomization}$ represents the diffraction efficiency of the basic structure model (without adopting randomization). If $\alpha_k$ distributes uniformly in the range of $[-\alpha/2, \alpha/2]$, the diffraction efficiency of the model is expressed by next expression (5). Here, $P_\alpha(\gamma) = \mathrm{sinc}(\alpha\gamma)$.

$$\left| U(\gamma)_{\gamma = \frac{p}{T}} \right|^2 = \sin c^2(\pi\alpha p/T) \times |U_{without\ randomization}|^2 \quad (5)$$

If $\alpha_k$ distributes in normal distribution to assume the average is zero, and standard deviation $\sigma_\alpha$ such as:

$$P_\alpha(\gamma) = e^{-\frac{1}{2}(\pi\sigma\gamma)^2} = e^{-\frac{1}{2}\left(\sigma\pi\frac{k}{T}\right)^2}$$

The diffraction efficiency of the model is expressed by next expression (6).

$$\left| U(\gamma)_{\gamma = \frac{p}{T}} \right|^2 = e^{-\frac{1}{2}\left(\sigma\pi\frac{p}{T}\right)^2} \times |U_{without\ randomization}|^2 \quad (6)$$

These expressions (4)-(6) show that the larger the degree of randomization of $\alpha_k$, the smaller the diffraction efficiency. As explained above, the ratio of the diffraction efficiency of the first-order diffracted light and that of zero-order light modulates by randomization of cycle length, and the magnitude of the modulation is expressed as $P_\alpha(1/T)/P_\alpha(0)$. On the assumption that an optical article is used in a severe environment, it is desirable that the ratio of the first-order diffracted light to that of zero-order light is below 0.01%, namely below 40 dB. Therefore, it is preferred that the cycle length is randomized so as to satisfy the expression (1).

$$P_\alpha(1/T)/P_\alpha(0) \leq 0.001 \quad (1)$$

In above described embodiments and variations, the micromirror device 3 is used as the output setting element, and the output light flux in desired shape is formed by letting the micromirror device 3 reflect the ultraviolet light emitted from the light source. However, not only reflection type devices like a micromirror device 3 but also transmission type devices like a transmissive liquid crystal device can be used as the output setting element.

It is to be noted that the embodiments and variations described above simply represent examples and the present invention is in no way limited to these examples as long as the features characterizing the present invention remain intact. Any other mode conceivable within the technical range of the present invention should, therefore, be considered to be within the scope of the present invention.

REFERENCE SIGNS LIST 1 light source
2 container
3 output setting element
4 stage
5, 50 stage driving mechanism
6, 60 projection optical system
7 control unit

The invention claimed is:

1. A method of manufacturing an optical article comprising:
   an output light flux generating process of generating an output light flux by inputting a light propagated from a light source to an output setting element having a repetition structure that generates a desired shape of output area and maintaining the desired shape of the output area for a desired period;
   a cured layer forming process of forming a cured layer at an irradiation area that is formed in correspondence with the output area by introducing the output light flux through a projection optical system into a container in which light-curable resin is contained and a stage is arranged and condensing the output light flux; and
   a first direction stage moving process of moving the stage in a desired distance along the first direction of the output flux propagating, wherein
   the output light flux generating process, the cured layer forming process and the first direction stage moving process are sequentially performed in this order, and thereby forming the optical article on a surface of the stage, and wherein
   the method further comprises an irradiation variation process that reduces the diffraction effect that comes from the repetition structure in the optical article, and
   the irradiation variation process is conducted by at least one of:
   an output light flux diffusion by passing the output light flux through a diffusion element in a diffusion angle of 5 to 25 degrees that is arranged at the container or at the vicinity of the container;

a second direction stage movement by moving the stage in a second direction which is perpendicular to the first direction in the cured layer generating process;
a condensing position adjusting so that a condensing position of the output light flux by the projection optical system deviates from the position at which the cured layer is to be formed;
a magnification variation by varying a magnification of the projection optical system in each of the cured layer generating processes; and
a first direction stage moving distance setting in the first direction stage moving process by setting at least two different values.

2. The method of manufacturing an optical article according to claim 1, wherein:
the output setting element is a micromirror device that includes a plurality of micromirrors, a reflective surface of each of the micromirrors can be set individually;
the desired shape of output area is generated by controlling the reflective surface of each of the micromirrors;
the output light flux is a reflected light flux which is reflected at the output area of the micromirror device; and
a surface image in accordance with the output area of the micromirror device is formed at the irradiation area.

3. The method of manufacturing an optical article according to claim 1 wherein
the diffusion angle of the output light flux passed through the diffusion element is in a diffusion angle of 8 to 12 degrees.

4. The method of manufacturing an optical component according to claim 1, wherein
the desired distance to be set for the first direction stage moving process has at least two different values.

5. The method of manufacturing an optical article according to claim 1, wherein
the desired distance to be set for the first direction stage moving process is randomized.

6. The method of manufacturing an optical article according to claim 5, wherein
the desired distance to be set for the first direction stage moving process is randomized as satisfying the following expression (1)

$$P_\alpha(1/T)/P_\alpha(0) \leq 0.001 \tag{1}$$

where, $P_\alpha(0) \geq 1$, T represents a constant value, $T + \alpha_k$ represents the k-th desired distance according to the thickness of the k-th layer, $\alpha_k$ represents a randomized value following a probability distribution of the Fourier transform of αk's probability density function $P_\alpha$.

7. An optical shaping apparatus comprising a control system configured for performing the method of claim 1, and including:
the light source;
the container that contains light-curable resin;
the output setting element having the repetition structure that receives the light propagated from the light source and sets the output light flux outputting toward the container;
the stage, arranged in the container, the stage being movable along the first direction of the output flux propagating, and the cured layer generated by curing the light-curable resin is formed on a surface thereof;
a stage driving mechanism that drives the stage;
the projection optical system, the projection optical system forming the irradiation area by condensing and introducing the output light flux into the container; and a first control unit, wherein
the first control unit performs:
a first controlling that performs to control the output setting element so as to generate the desired shape of output area and maintain the desired shape of the output area for the desired period; and
a second controlling that performs to control the stage drive mechanism so as to move the stage in a desired distance in the first direction after elapsing the desired period, and
the optical shaping apparatus further comprises an irradiation variation device that reduces the diffraction effect that comes from repetition in the forming of the optical article.

8. The optical shaping apparatus according to claim 7, wherein
the irradiation variation device comprises at least one of:
the diffusion element to perform the light flux diffusion and being arranged at the container or at a position being equal to or less than 5 mm from a surface of the container,
a second control unit that controls the second direction stage movement;
a third control unit that controls the condensing position adjusting;
a fourth control unit controls the magnification varying; and
a fifth control unit controls the first direction stage moving distance setting.

9. The optical shaping apparatus according to claim 7, wherein
the output setting element is a micromirror device that includes a plurality of micromirrors, a reflective surface of each of the micromirrors can be set individually;
the desired shape of output area is generated by controlling the reflective surface of each of the micro mirrors;
the output light flux is a reflected light flux which is reflected at the output area of the micromirror device; and
a surface image in accordance with the output area of the micromirror device is formed at the irradiation area.

10. The optical shaping apparatus according to claim 8, wherein
the diffusion element diffuses the output light flux in a diffusion angle of 8 to 12 degrees and arranged at the container or at the position being equal to or less than 1 mm from a surface of the container.

11. The optical shaping apparatus according to claim 7, wherein:
the first control unit controls so as to perform the first controlling and the second controlling repeatedly in turn.

12. The optical shaping apparatus according to claim 7, wherein:
the first control unit controls in the second controlling so as to set the desired distance randomized.

13. An optical article manufactured by the method according to claim 1, wherein
when a light incidents on the optical article, a first-order light that is generated by diffraction is equal to or less than 6% of a zero-order light.

14. The optical article according to claim 13, wherein the optical article is a lens.

* * * * *